United States Patent
Goto

(10) Patent No.: US 12,136,910 B2
(45) Date of Patent: Nov. 5, 2024

(54) ACOUSTIC WAVE RESONATOR WITH PATTERNED CONDUCTIVE LAYER FOR TRANSVERSE MODE SUPPRESSION

(71) Applicant: Skyworks Solutions, Inc., Irvine, CA (US)

(72) Inventor: Rei Goto, Osaka (JP)

(73) Assignee: Skyworks Solutions, Inc., Irvine, CA (US)

( * ) Notice: Subject to any disclaimer, the term of this patent is extended or adjusted under 35 U.S.C. 154(b) by 210 days.

(21) Appl. No.: 16/892,743

(22) Filed: Jun. 4, 2020

(65) Prior Publication Data

US 2020/0389151 A1 Dec. 10, 2020

Related U.S. Application Data

(60) Provisional application No. 62/858,905, filed on Jun. 7, 2019.

(51) Int. Cl.
*H03H 9/25* (2006.01)
*H03H 3/10* (2006.01)
(Continued)

(52) U.S. Cl.
CPC ............... *H03H 9/25* (2013.01); *H03H 3/10* (2013.01); *H03H 9/02834* (2013.01);
(Continued)

(58) Field of Classification Search
CPC .. H03H 9/25; H03H 9/02834; H03H 9/02992; H03H 9/145; H03H 9/6489
See application file for complete search history.

(56) References Cited

U.S. PATENT DOCUMENTS 7,576,471 B1 8/2009 Solal
8,294,331 B2 10/2012 Abbott et al.
(Continued)

FOREIGN PATENT DOCUMENTS

WO WO 2017/161303 A1 9/2017

OTHER PUBLICATIONS

Nakumura et al., "Suppression Mechanism of Transverse-Mode Spurious Responses in SAW Resonators on a SiO2/Al/LiNbO3 Structure", IEEE International Ultrasonics Symposium Proceedings, 2011.

(Continued)

*Primary Examiner* — Samuel S Outten
(74) *Attorney, Agent, or Firm* — Knobbe, Martens, Olson & Bear, LLP

(57) ABSTRACT

Aspects of this disclosure relate to an acoustic wave resonator with a patterned conductive layer. The acoustic wave resonator can include a piezoelectric layer, an interdigital transducer electrode over the piezoelectric layer, and a temperature compensation layer over the interdigital transducer electrode. The interdigital transducer electrode can include a bus bar and fingers extending from the bus bar. The fingers can each include an edge portion and a body portion. The patterned conductive layer can overlap the edge portions of the fingers. The patterned conductive layer can conductive portions that are spaced apart from each other. A portion of the temperature compensation layer can be positioned between the patterned conductive layer and the interdigital transducer electrode.

20 Claims, 13 Drawing Sheets

(51) Int. Cl.
  *H03H 9/02*   (2006.01)
  *H03H 9/145*  (2006.01)
  *H03H 9/64*   (2006.01)
  *H04B 1/38*   (2015.01)

(52) U.S. Cl.
  CPC ........ *H03H 9/02992* (2013.01); *H03H 9/145* (2013.01); *H03H 9/6489* (2013.01); *H04B 1/38* (2013.01)

(56) References Cited

U.S. PATENT DOCUMENTS

| | | | |
|---|---|---|---|
| 8,741,683 | B2 | 6/2014 | Huang et al. |
| 10,090,825 | B2 | 10/2018 | Kuroyanagi |
| 11,368,137 | B2 | 6/2022 | Goto et al. |
| 2012/0161577 | A1* | 6/2012 | Abbott ............... H03H 9/02724 310/313 C |
| 2013/0051588 | A1* | 2/2013 | Ruile ................. H03H 9/02858 29/25.35 |
| 2015/0243873 | A1 | 8/2015 | Nakanishi et al. |
| 2016/0149553 | A1 | 5/2016 | Yoon et al. |
| 2017/0170808 | A1* | 6/2017 | Iwaki ................. H03H 9/14532 |
| 2017/0331451 | A1 | 11/2017 | Yoon et al. |
| 2018/0054179 | A1 | 2/2018 | Gamble et al. |
| 2018/0097508 | A1 | 4/2018 | Iwamoto et al. |
| 2018/0269852 | A1* | 9/2018 | Daimon ................... H03H 9/25 |
| 2019/0089328 | A1* | 3/2019 | Unterreithmeier .......................... H03H 9/02858 |
| 2019/0356296 | A1* | 11/2019 | Mimura ............. H03H 9/02637 |
| 2020/0328727 | A1* | 10/2020 | Daimon ............. H03H 9/14547 |
| 2022/0286105 | A1 | 9/2022 | Goto et al. |

OTHER PUBLICATIONS

Mimura et al, "Low Acoustic Velocity Rayleigh SAW Technology for Miniaturization of High Performance TC-SAW Devices," Seventh International Symposium on Acoustic Wave Devices for Future Mobile Communication Systems., 2018.

* cited by examiner

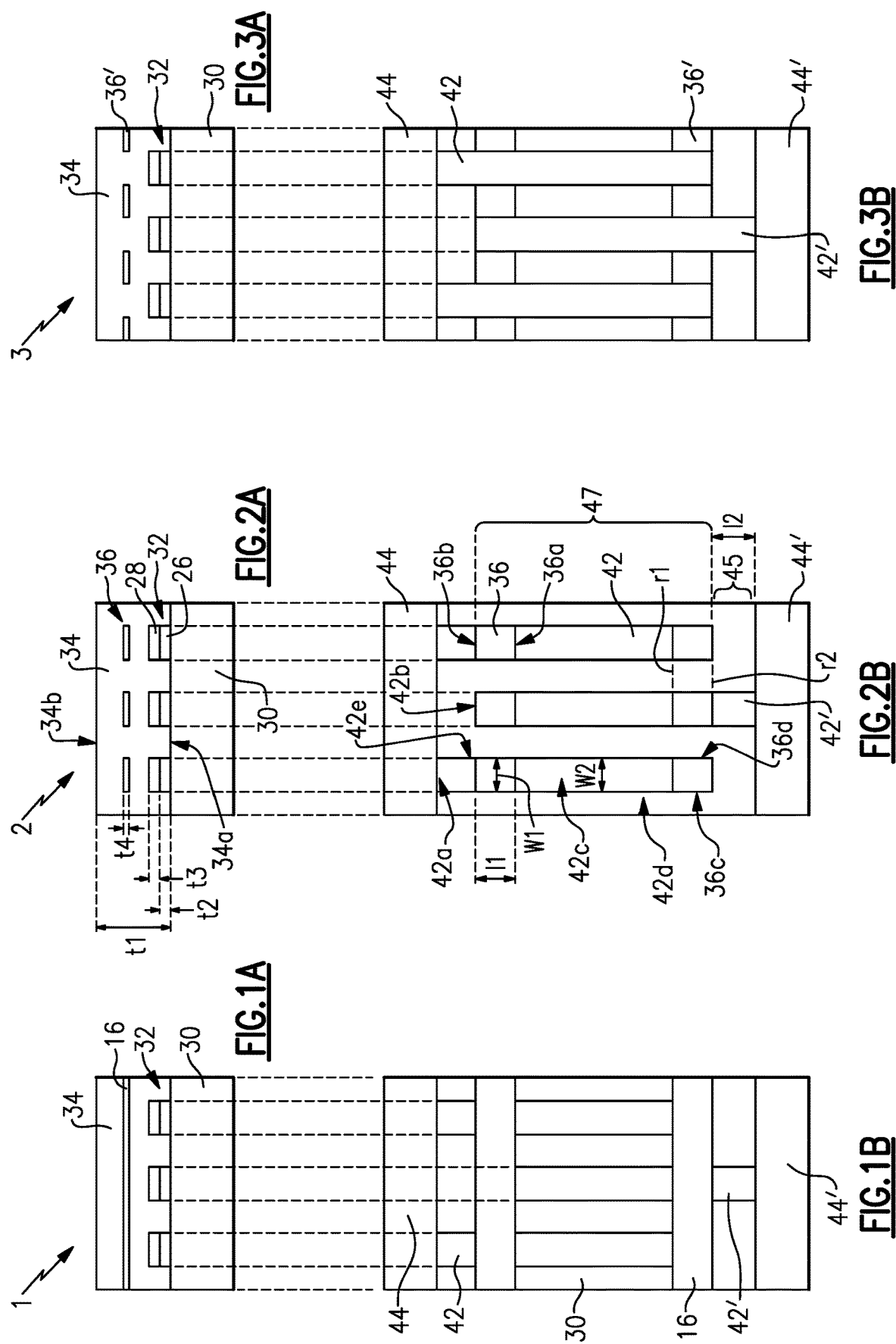

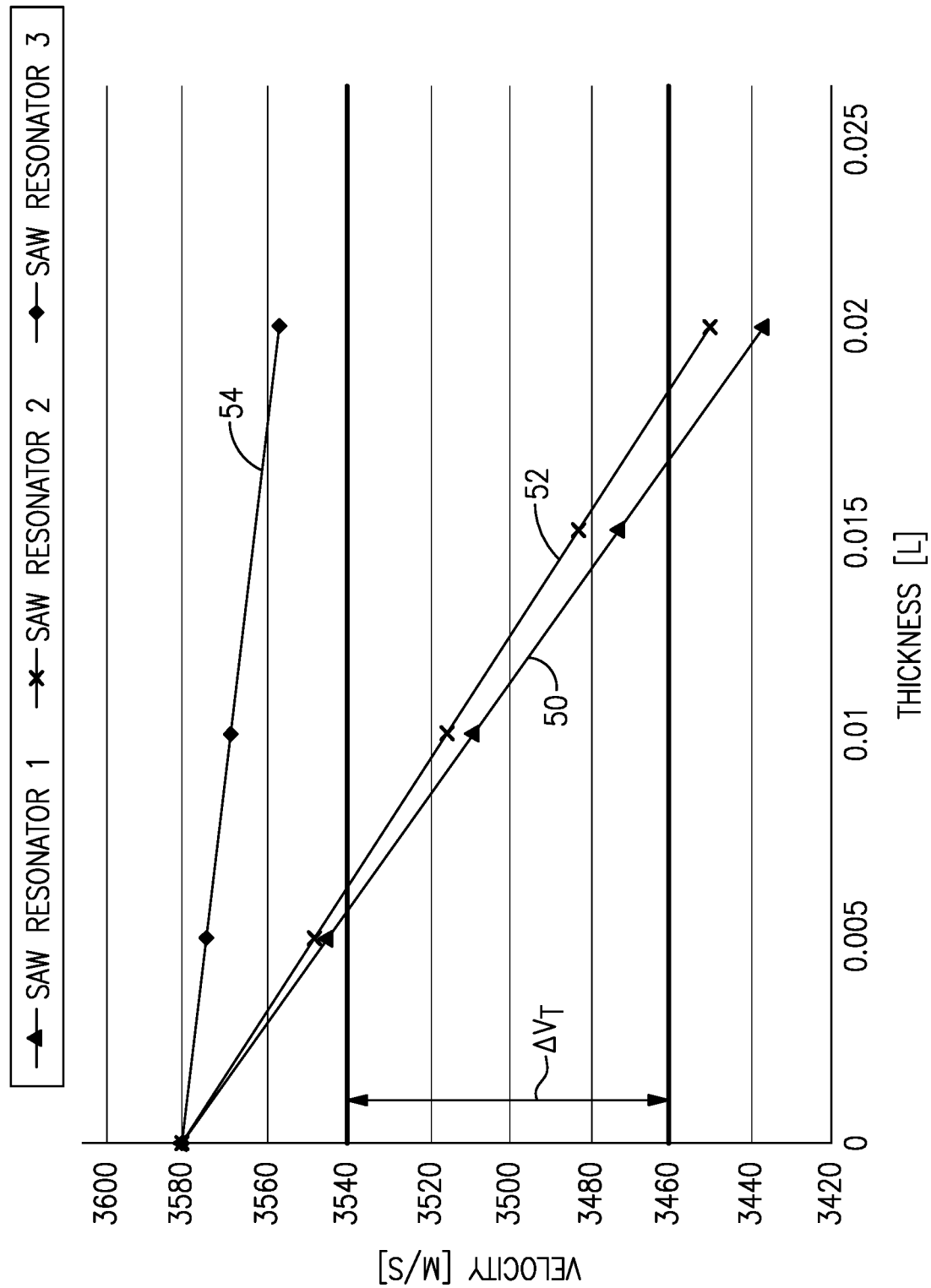

ACOUSTIC WAVE RESONATOR WITH PATTERNED CONDUCTIVE LAYER FOR TRANSVERSE MODE SUPPRESSION

CROSS REFERENCE TO PRIORITY APPLICATIONS

This application claims the benefit of priority of U.S. Provisional Patent Application No. 62/858,905, filed Jun. 7, 2019 and titled "ACOUSTIC WAVE RESONATOR WITH PATTERNED CONDUCTIVE LAYER FOR TRANSVERSE MODE SUPPRESSION," the disclosures of each of which are hereby incorporated by reference in their entireties herein.

BACKGROUND

Technical Field

Embodiments of this disclosure relate to acoustic wave resonators with transverse mode suppression.

Description of Related Technology

Piezoelectric microelectromechanical systems (MEMS) resonators can be used in radio frequency systems. Piezoelectric MEMS resonators can process electrical signals using mechanically vibrating structures. Example piezoelectric MEMS resonators include surface acoustic (SAW) resonators and temperature compensated surface acoustic wave (TCSAW) resonators.

Acoustic wave filters can include TCSAW resonators. Acoustic wave filters can filter radio frequency signals in radio frequency electronic systems. For instance, filters in a radio frequency front end of a mobile phone can include acoustic wave filters. Multiple acoustic wave filters can be arranged as a multiplexer, such as a duplexer.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

In one aspect, an acoustic wave resonator is disclosed. The acoustic wave resonator can include a piezoelectric layer, and an interdigital transducer electrode that is positioned over the piezoelectric layer. The interdigital transducer electrode includes a bus bar and fingers that extends from the bus bar. The fingers each includes an edge portion and a body portion. The acoustic wave resonator can also include a temperature compensation layer that is positioned over the interdigital transducer electrode. The acoustic wave resonator can further include a patterned conductive layer that includes conductive portions that overlaps the edge portions of the fingers. The conductive portions are spaced apart from each other, and a portion of the temperature compensation layer is positioned between the patterned conductive layer and the interdigital transducer electrode.

In an embodiment, the conductive portions are separated by material of the temperature compensation layer. Each conductive portion of the patterned conductive layer can have a conductive portion width that is at least as wide as a finger width of a respective underlying edge portion.

In an embodiment, the patterned conductive layer has a density that is at least as high as a density of a material of the interdigital transducer electrode that is in contact with the piezoelectric layer.

In an embodiment, the patterned conductive layer is disposed over a top surface of the temperature compensation layer, the top surface being on an opposite side of the temperature compensation layer than the piezoelectric layer.

In an embodiment, the acoustic wave resonator further includes a second patterned conductive layer that is positioned between the patterned conductive layer and the interdigital transducer electrode. The patterned conductive layer can have a higher mass than the second patterned conductive layer. The second patterned conductive layer can be a titanium layer. The patterned conductive layer can be a molybdenum layer. The patterned conductive layer can be a tungsten layer. The second patterned conductive layer can have higher adhesion with the temperature compensation layer than the patterned conductive layer with the temperature compensation layer.

In an embodiment, the acoustic wave resonator further includes a cover layer over the temperature compensation layer. The cover layer can be a silicon nitride layer or an aluminum oxide layer.

In an embodiment, the temperature compensation layer has a thickness from a lower surface to an upper surface opposite the lower surface. The patterned conductive layer is spaced apart from the lower surface by a distance that is within 20% to 80% of the thickness of the temperature compensation layer.

In an embodiment, the patterned conductive layer is non-overlapping with the body portions of the fingers.

In an embodiment, the acoustic wave resonator is a surface acoustic wave resonator that is configured to generate a surface acoustic wave.

In an embodiment, the acoustic wave resonator further includes a second bus bar and second fingers that extends from the second bus bar. The second fingers each includes an edge portion and a body portion. The patterned conductive layer can include second conductive portions that overlap edge portions of the second fingers. A portion of the conductive portions overlaps edge portion of a finger of the fingers that extends from the bus bar and a portion of a finger of the second fingers that extends from the second bus bar.

In one aspect, an acoustic wave resonator is disclosed. The acoustic wave resonator can include a piezoelectric layer, and an interdigital transducer electrode that is positioned over the piezoelectric layer. The interdigital transducer electrode includes a bus bar and fingers extending from the bus bar. The fingers each includes an edge portion and a body portion. The acoustic wave resonator can also include a temperature compensation layer that is positioned over the interdigital transducer electrode. The temperature compensation layer has a thickness from a lower surface to an upper surface opposite the lower surface. The lower surface is closer to the interdigital transducer electrode than the upper surface. The acoustic wave resonator can further include a patterned conductive layer that overlaps the edge portions of the fingers. The patterned conductive layer has a break between two adjacent fingers of the fingers. The patterned conductive layer has a density that is at least as high as a density of a material of the interdigital transducer electrode that is in contact with the piezoelectric layer. The patterned conductive layer is spaced apart from the lower surface by a distance that is within 20% to 80% of the thickness of the temperature compensation layer.

In an embodiment, the patterned conductive layer includes islands separated from each other. The islands can be separated by portions of the temperature compensation layer. Each island of the patterned conductive layer can have an island width. The island width can be at least as wide as a finger width of respective underlying edge portion of the finger. The island width can have a variation that is ±5% of the finger width of the underlying edge portion.

In an embodiment, the patterned conductive layer is disposed over the upper surface of the temperature compensation layer.

In an embodiment, the acoustic wave resonator further includes a second patterned conductive layer that is positioned between the patterned conductive layer and the interdigital transducer electrode. The patterned conductive layer can have a higher mass than the second conductive layer. The second patterned conductive layer can be a titanium layer. The patterned conductive layer can be a molybdenum layer or a tungsten layer. The second patterned conductive layer can have higher adhesion with the temperature compensation layer than the patterned conductive layer with the temperature compensation layer.

In an embodiment, the acoustic wave resonator further includes a cover layer over the temperature compensation layer. The cover layer can be a silicon nitride layer or an aluminum oxide layer.

In an embodiment, an acoustic wave filter that includes acoustic wave resonators that are arranged to filter a radio frequency signal is disclosed. The acoustic wave resonators can include any of the acoustic wave resonators disclosed herein. A front end module can include the acoustic wave filter, other circuitry, and a package that encloses the surface acoustic wave filter and the other circuitry. The other circuitry can include a multi-throw radio frequency switch. The other circuitry can include a power amplifier. A wireless communication device can include an antenna and the acoustic wave filter. The acoustic wave filter can be arranged to filter a radio frequency signal that is associated with the antenna.

In one aspect, a method of manufacturing an acoustic wave resonator is disclosed. The method can include providing an acoustic wave resonator structure with a temperature compensation layer that is positioned over an interdigital transducer electrode. The interdigital transducer electrode includes fingers that extend from a bus bar. The fingers each includes an edge portion and a body portion. The method can also include forming a patterned conductive layer that overlaps with the edge portions of the fingers of the interdigital transducer electrode and that is non-overlapping with the body portions. The patterned conductive layer includes a break between adjacent fingers of the fingers. Material of the temperature compensation layer is positioned between the patterned conductive layer and the interdigital transducer electrode.

In an embodiment, the method further includes forming a second patterned conductive layer that is positioned between the patterned conductive layer and the interdigital transducer electrode. The second patterned conductive layer can be formed before the patterned conductive layer. The second patterned conductive layer can be a titanium layer. The patterned conductive layer can be a molybdenum layer.

In an embodiment, the method further includes forming temperature compensation material over the patterned conductive layer. The temperature compensation layer can be a silicon dioxide layer.

In an embodiment, the first layer of the patterned conductive layer is formed within 20% to 80% of a thickness of the temperature compensation layer from a piezoelectric layer of the acoustic wave resonator.

In an embodiment, the method further includes depositing a silicon nitride layer over the temperature compensation layer.

In an embodiment, the method further includes depositing an aluminum oxide layer over the temperature compensation layer.

In an embodiment, the acoustic wave resonator includes any suitable combination of features disclosed herein.

BRIEF DESCRIPTION OF THE DRAWINGS

Embodiments of this disclosure will now be described, by way of non-limiting example, with reference to the accompanying drawings.

FIG. 1A illustrates a cross section of a surface acoustic wave (SAW) resonator.

FIG. 1B illustrates a top view of the SAW resonator of FIG. 1A.

FIG. 2A illustrates a cross section of a SAW resonator according to one embodiment.

FIG. 2B illustrates a top view of the SAW resonator of FIG. 2A.

FIG. 3A illustrates a cross section of a SAW resonator.

FIG. 3B illustrates a top view of the SAW resonator of FIG. 3A.

FIG. 4 is a graph showing simulated velocity differences of a surface acoustic wave in SAW resonators.

DETAILED DESCRIPTION OF CERTAIN EMBODIMENTS

Figure 5:
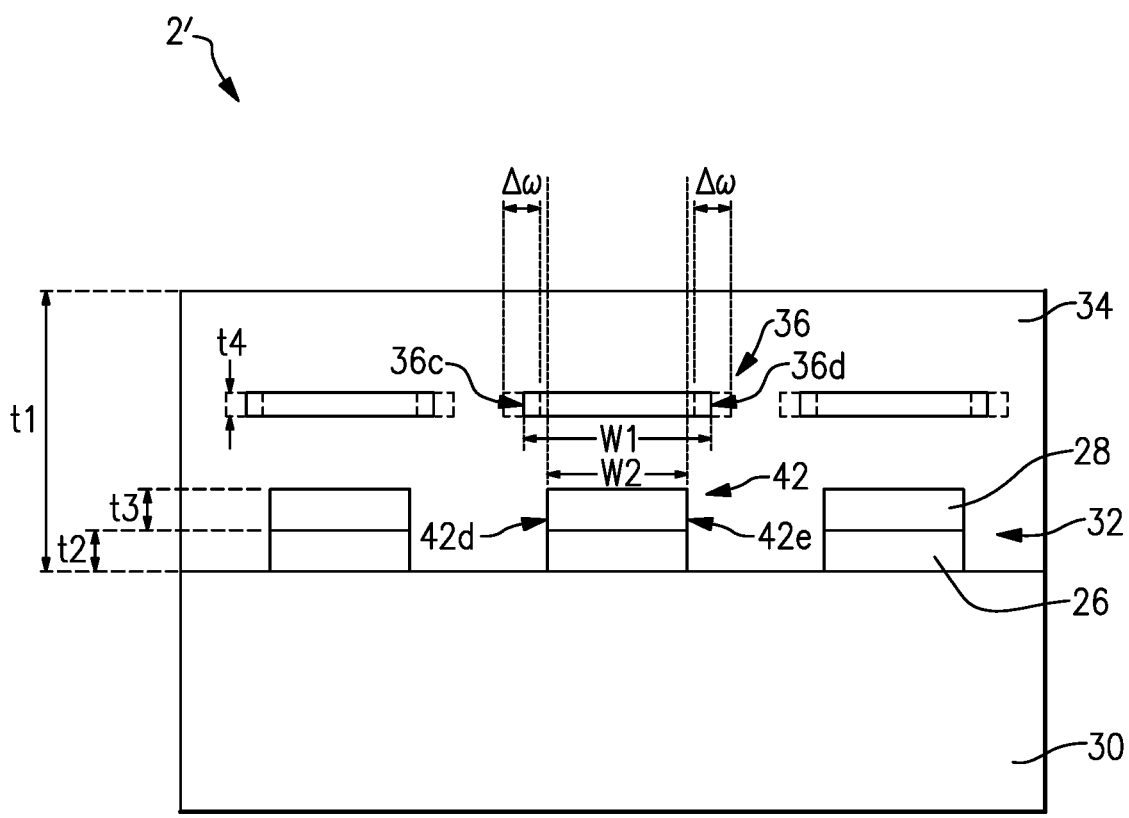
FIG. 5 illustrates a cross section of a portion of a SAW resonator according to one embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can be implemented with surface acoustic wave (SAW) devices. The SAW devices can be SAW resonators.

In general, high quality factor (Q), large effective electromechanical coupling coefficient ($k^2$), high frequency ability, and spurious free response can be significant aspects for micro resonators to enable low-loss filters, stable oscillators, and sensitive sensors. SAW resonators can have a relatively strong transverse mode in and/or near a pass band. The presence of the relatively strong transverse modes can hinder the accuracy and/or stability of oscillators and sensors, as well as negatively affect the performance of acoustic wave filters by creating relatively severe passband ripples and possibly limiting the rejection.

Therefore, transverse mode suppression can be significant for SAW resonators. A technical solution for suppressing transverse modes is to create a border region with a different frequency from an active region according to the mode dispersion characteristic. This can be referred to as a "piston mode." A piston mode can be obtained to cancel out the transverse wave vector in a lateral direction without significantly degrading the $k^2$ or Q. By including a relatively small border region with a slower velocity on the edge of the acoustic aperture of a SAW resonator, a propagating mode can have a zero (or approximately zero) transverse wave vector in the active aperture.

One way of achieving piston mode is to include a material that can cause a magnitude of the velocity in the underlying region of the SAW resonator to be increased. The material can be, for example, silicon nitride (SiN). As an example, SiN can be positioned over a center region of an interdigital transducer electrode (IDT) and the border region of the IDT can be free from the SiN.

A relatively high density IDT electrode, such as a tungsten (W) IDT, can be used for downsizing and/or slowing down the SAW propagation velocity of a temperature-compensated SAW (TCSAW) resonator. Transverse mode suppression can be significant for TCSAW device performance. However, a TCSAW resonator with an IDT that includes tungsten can encounter difficulty in suppressing transverse modes. For instance, a silicon nitride layer with a trench over a temperature compensation layer for piston mode may not sufficiently suppress transverse modes in such resonators. This can be due to resonator displacement being distributed deep inside a silicon dioxide (SiO2) temperature compensation layer of the TCSAW resonator.

Another way to achieve piston mode is to provide a conductive strip on edges of an IDT electrode active regions of the SAW resonator. The transverse wave vector can be real in the border region and imaginary on a gap region. A piston mode SAW resonator can have even order modes that have a multiple of full wave lengths in the active region, which should not significantly couple to electrical domain.

An IDT electrode with a tungsten layer has a relatively high density. Acoustic energy can be gathered into the IDT side. In that case, the perturbation on a surface of a silicon dioxide temperature compensation layer over the IDT electrode can be ineffective. A conductive strip buried in the silicon dioxide temperature compensated layer that includes a tungsten layer can effectively control the velocity of a TCSAW resonator with an IDT electrode that includes tungsten. The combination of the conductive strip material and the IDT electrode material can be significant. For example, a conductive strip with a molybdenum layer may not sufficiently suppress transverse modes in a TCSAW resonator with an IDT electrode that includes tungsten. The conductive strip can include a layer having a density that is at least as high as a density of a material of the IDT electrode that is in contact with a piezoelectric layer or the TCSAW resonator.

SAW resonators (e.g., TCSAW resonators) that include a continuous metal strip that includes a relatively high density metal layer may effectively control the velocity of a TCSAW resonator with an IDT electrode. The continuous metal strip can be buried in a temperature compensation layer, such as a silicon dioxide layer. However, a heat shock of a high temperature process can cause the continuous metal strip to delaminate. Delamination of such a continuous metal strip can degrade transverse mode suppression performance.

Aspects of this disclosure relate to acoustic wave resonators (e.g., TCSAW resonators) that include a patterned conductive layer. The patterned conductive layer includes conductive portions that are separated from each other. The conductive portions of the patterned conductive layer can overlap edge portions of interdigital transducer electrode fingers of an acoustic wave resonator. Separating the conductive portions of the patterned conductive layer can release mechanical stress during a fabrication process. The patterned conductive layer can include a relatively high density metal layer. The patterned conductive layer can be buried in a temperature compensation layer, such as a silicon dioxide layer, that is positioned over an interdigital transducer electrode of an acoustic wave resonator, or positioned over the temperature compensation layer.

Embodiments of a SAW resonator disclosed herein include a patterned conductive layer that includes island portions. The island portions of the patterned conductive layer can be separated from one another. The island portions of the patterned conductive layer overlaps edge portions of fingers of an IDT electrode.

FIG. 1A illustrates a cross section of a surface acoustic wave (SAW) resonator 1. The SAW resonator 1 includes a piezoelectric layer 30, an IDT electrode 32 over the piezoelectric layer 30, a temperature compensation layer 34 over the IDT electrode 32, and a metal strip 16 buried in the temperature compensation layer 34.

FIG. 1B illustrates a top view of the SAW resonator 1 of FIG. 1A. For showing the underlying layers more clearly, the temperature compensation layer 34 is not illustrated in FIG. 1B. The dashed lines between FIGS. 1A and 1B show relative positions of the illustrated components. The cross section of FIG. 1A corresponds to the top view of the SAW resonator 1 in view 1B along a line extending through the conductive strip 16. The IDT electrode 32 of the illustrated SAW resonator 1 includes bus bars 44, 44' and fingers 42 extending from one of the bus bars 44. The SAW resonator 1 also includes fingers 42' extending from the other bus bar 44'.

FIG. 2A illustrates a cross section of a surface acoustic wave (SAW) resonator 2 according to one embodiment. The SAW resonator 2 includes a piezoelectric layer 30, an IDT electrode 32 over the piezoelectric layer 30, and a temperature compensation layer 34 over the IDT electrode 32. The SAW resonator 2 also includes a patterned conductive structure (e.g., a patterned conductive layer 36) buried in the temperature compensation layer 34. Other patterned conductive structures can be a multilayer patterned conductive structures, for example, as shown in FIGS. 8A to 8D.

The patterned conductive layer 36 at least overlaps edge portions of fingers of the IDT electrode 32. The patterned conductive layer 36 can implement a piston mode. The patterned conductive layer 36 includes conductive portions that are spaced apart from each other. The patterned conductive layer 36 includes breaks between conductive portions over adjacent fingers of the IDT electrode 32. Portions of the piezoelectric layer 30 between fingers of the IDT 32 can be non-overlapping with the patterned conductive layer 36. The patterned conductive layer 36 is non-continuous.

In some embodiments, the patterned conductive layer 36 is spaced apart from the lower surface 34a of the temperature compensation layer 34 by a distance that is within 20% to 80% of the thickness t1 of the temperature compensation layer 34. For example, the patterned conductive layer 36 can be positioned at a distance from the lower surface 34a that is about 50% of the thickness t1 of the temperature compensation layer 34.

The piezoelectric layer 30 can include any suitable piezoelectric layer, such as a lithium niobate (LN) layer or a lithium tantalate (LT) layer. A thickness of the piezoelectric layer 30 can be selected based on a wavelength λ or L of a surface acoustic wave generated by the surface acoustic wave resonator 2 in certain applications. The IDT electrode 32 has a pitch that sets the wavelength λ or L of the surface acoustic wave device 2. The piezoelectric layer 30 can be sufficiently thick to avoid a significant frequency variation.

The illustrated IDT electrode 32 includes a first layer 26 and a second layer 28. The IDT electrode 32 includes fingers 42 and bus bars 44, which are illustrated in FIG. 2B. In the surface acoustic wave resonator 2, the IDT electrode 32 includes separate IDT layers 26 and 28 that impact acoustic properties and electrical properties, respectively. Accordingly, electrical properties, such as insertion loss, can be improved by adjusting one of the IDT layers (IDT layer 28) without significantly impacting acoustic properties.

The first layer 26 of the IDT electrode 32 can be referred to as a lower electrode layer. The first layer 26 of the IDT electrode 32 is disposed between the second layer 28 of the IDT electrode 32 and the piezoelectric layer 30. As illustrated, the first layer 26 of the IDT electrode 32 has a first side in physical contact with the piezoelectric layer 30 and a second side in physical contact with the second layer 28 of the IDT electrode 32. In some embodiments, the first layer 26 can impact acoustic properties of the SAW resonator 2. For instance, a thickness t2 of the first layer 26 of the IDT electrode 32 can impact resonant frequency of the surface acoustic wave device 2.

The second layer 28 of the IDT electrode 32 can be referred to as an upper electrode layer. The second layer 28 of the IDT electrode 32 is disposed between the first layer 26 of the IDT electrode 32 and the temperature compensation layer 34. As illustrated, the second layer 28 of the IDT electrode 32 has a first side in physical contact with the first layer 26 of the IDT electrode 32 and a second side in physical contact with the temperature compensation layer 34. In some embodiments, the second layer 28 of the IDT electrode 32 can impact electrical properties of the SAW resonator 2. A thickness t3 of the second layer 28 of the IDT electrode 32 can impact, for example, insertion loss of the SAW resonator 2. The thickness t3 of the second layer 28 of the IDT electrode 32 may not significantly impact acoustic properties of the SAW resonator 2.

The IDT electrode 32 can include any suitable material. For example, the first layer 26 can be tungsten (W) and the second layer 28 can be aluminum (Al) in certain embodiments. The IDT electrode 12 may include one or more other metals, such as copper (Cu), Magnesium (Mg), titanium (Ti), molybdenum (Mo), etc. The IDT electrode 32 may include alloys, such as AlMgCu, AlCu, etc. The first layer 26 of the IDT electrode 32 has a thickness t2 and the second layer 28 of the IDT electrode 12 has a thickness t3. In some embodiments, the thickness t2 of the first layer 26 can be in a range from 0.03 L to 0.10 L (e.g., about 0.08 L) and the thickness t3 of the second layer 28 can be in a range from 0.02 L to 0.08 L (e.g., about 0.04 L). For example, when the wavelength L is 4 μm, the thickness t2 of the first layer 26 can be 320 nm and the thickness t3 of the second layer 28 can be 160 nm.

Although some embodiments disclosed herein include IDT electrodes with two IDT layers, any suitable principles and advantages disclosed herein can be applied to single layer IDT electrodes or multi-layer IDT electrodes that include three or more IDT layers.

The temperature compensation layer 34 can include any suitable temperature compensation material. For example, the temperature compensation layer 34 can be a silicon dioxide ($SiO_2$) layer. The temperature compensation layer 34 can be a layer of any other suitable material having a positive temperature coefficient of frequency for SAW resonators with a piezoelectric layer 30 having a negative coefficient of frequency. For instance, the temperature compensation layer 34 can be a tellurium dioxide ($TeO_2$) layer or a silicon oxyfluoride (SiOF) layer in certain applications. The temperature compensation layer 34 can include any suitable combination of $SiO_2$, $TeO_2$, and/or SiOF.

The temperature compensation layer 34 can bring the temperature coefficient of frequency (TCF) of the SAW resonator 2 closer to zero relative to a similar SAW resonator without the temperature compensation layer 34. The temperature compensation layer 34 together with a lithium niobate (LN) piezoelectric layer can improve the electromechanical coupling coefficient ($k^2$) of the SAW resonator 2 relative to a similar SAW resonator with a lithium tantalate piezoelectric layer and without the temperature compensation layer 34. This advantage of the temperature compensation layer 34 can be more pronounced when the SAW resonator 2 includes an LN layer as the piezoelectric layer 30. The temperature compensation layer 34 has a thickness t1 measured from a lower surface 34a to an upper surface 34b opposite the lower surface 34a. In some embodiments, the thickness t1 of the temperature compensation layer 34 can be in a range from 0.1 L to 0.5 L. For instance, the thickness t1 can be about 0.3 L in certain applications. For example, when the wavelength L is 4 µm, the thickness t1 of the temperature compensation layer 34 can be 1200 nm.

FIG. 2B illustrates a top view of the SAW resonator 2 of FIG. 2A. For showing the underlying layers more clearly, the temperature compensation layer 34 is not illustrated in FIG. 2B. The dashed lines between FIGS. 2A and 2B show relative positions of the illustrated components. The cross section of FIG. 2A corresponds to the top view of the SAW resonator 2 in view 2B along a line extending through the conductive layer 36. The IDT electrode 32 of the illustrated SAW resonator 2 of FIGS. 2A and 2B includes two bus bars 44, 44' and two fingers 42 extending from one of the bus bars 24 and a finger 42' extending from the other bus bar 44'. Any suitable number of fingers for a particular application can extend from the bus bars 44, 44'. Each finger 42, 42' has a proximate end 42a that is in contact with a bus bar 44, 44' and a distal end 42b opposite the proximate end 42a. A body portion 42c of the finger 42, 42' extends between the proximate end 42a and the distal end 42b. A portion near the distal end 42b can be referred as an edge portion. An aperture 47 of the SAW resonator 2 can be defined by the region between distal ends 42b of fingers 42, 42' extending from opposing bus bars 44, 44'.

In certain applications, the patterned conductive layer 36 can be a high density metal layer. In some embodiments, the high density metal layer can include any suitable metal that has a density that is equal to or greater than the density of the first layer 26 (or the lower electrode layer) of the IDT electrode 32. For example, the high density metal layer can include molybdenum (Mo), tungsten (W), gold (Au), silver (Ag), ruthenium (Ru), iridium (Ir), or the like, depending on the density of the first layer 26 of the IDT electrode 32.

The patterned conductive layer 36 has a thickness t4. The thickness t4 of the patterned conductive layer 36 can be a thickness of the high density metal layer 48 in the illustrated embodiment of FIGS. 2A and 2B. The thickness t4 of the patterned conductive layer 36 can be selected based on a wavelength λ or L of a surface acoustic wave generated by the surface acoustic wave resonator 2. For example, the thickness t4 of the patterned conductive layer 36 can be in a range from 0.01 L to 0.03 L in certain applications.

The patterned conductive layer 36 has an inner edge 36a and an outer edge 36b. The outer edge 36b of the patterned conductive layer 36 are illustrated as being aligned with the distal ends 42b of the fingers 42, 42' having a gap 45 between the outer edge 36b and the bus bar 44, 44'. However, in some embodiments, the outer edge 36b can be anywhere between the distal end 42b of the finger 42, 42' that extends from one bus bar 44, 44' and the other bus bar 44, 44'. In some other embodiments, the outer edge 36b may overlap with the bus bar 44, 44' or be outside of the IDT electrode 32. The patterned conductive layer 36 has a length l1 from the inner edge 36a to the outer edge 36b of the metal strip 36. For example, the width l1 of the metal strip can be in a range from 0.5 L to 1.5 L. The gap 45 has a length l2 from the outer edge 36b and the bus bar 44, 44'. For example, the length l2 of the gap 45 can be greater than 0.9 L.

The patterned conductive layer 36 of SAW resonator 2 illustrated in FIGS. 2A and 2B includes conductive portions that are separated from one another. The conductive portions are spaced apart from each other. In some embodiments, the conductive portions can be completely separated from each other. In such embodiments, each of the conductive portions can be an island of metal as illustrated in FIGS. 2A and 2B. The island of the patterned conducive layer 36 has side edges 36c, 36d. The island of the patterned conducive layer 36 has an island width w1 from the side edge 36c to the other side edge 36d. Each island of the patterned conductive layer 36 can be rectangular. For example, in FIG. 2B, the illustrated islands are square. A finger 42, 42' has side edges 42d, 42e. The finger has a finger width w2 from the side edge 42d to the other side edge 42e. The SAW resonator 2 illustrated in FIGS. 2A and 2B has the island width w1 that is generally similar to the finger width w2. However, the island width w1 and the finger width w2 can be different in some embodiments. Examples of this will be explained more with respect to FIG. 5.

As illustrated in FIG. 2B, the conductive portions of the patterned conductive layer 36 overlap with portions of the fingers 42, 42' including the edge portion and a portion between the proximate end 42a and the edge portion. Reference lines r1, r2 illustrate relative positions of the edge portion of the finger 42 that extends from the bus bar 44 and the portion between the proximate end 42a and the edge portion on an adjacent finger 42' that extends from the other bus bar 44'. The conductive portions closer to the bus bar 44 can be referred to as a first set of conductive portions and the conductive portions closer to the bus bar 44' can be referred to as a second set of conductive portions. In the illustrated embodiment of the SAW resonator 2, the first set of conductive portions is equally spaced from the bus bar 44 by the gap 45, and the second set of conductive portions is equally spaced from the bus bar 44' by the gap 45. In the illustrated embodiment, no portion of the patterned conducive layer 36 overlaps with an intervening portion between the first set of conductive portions and the second set of conductive portions in the aperture 47.

Figure 9:
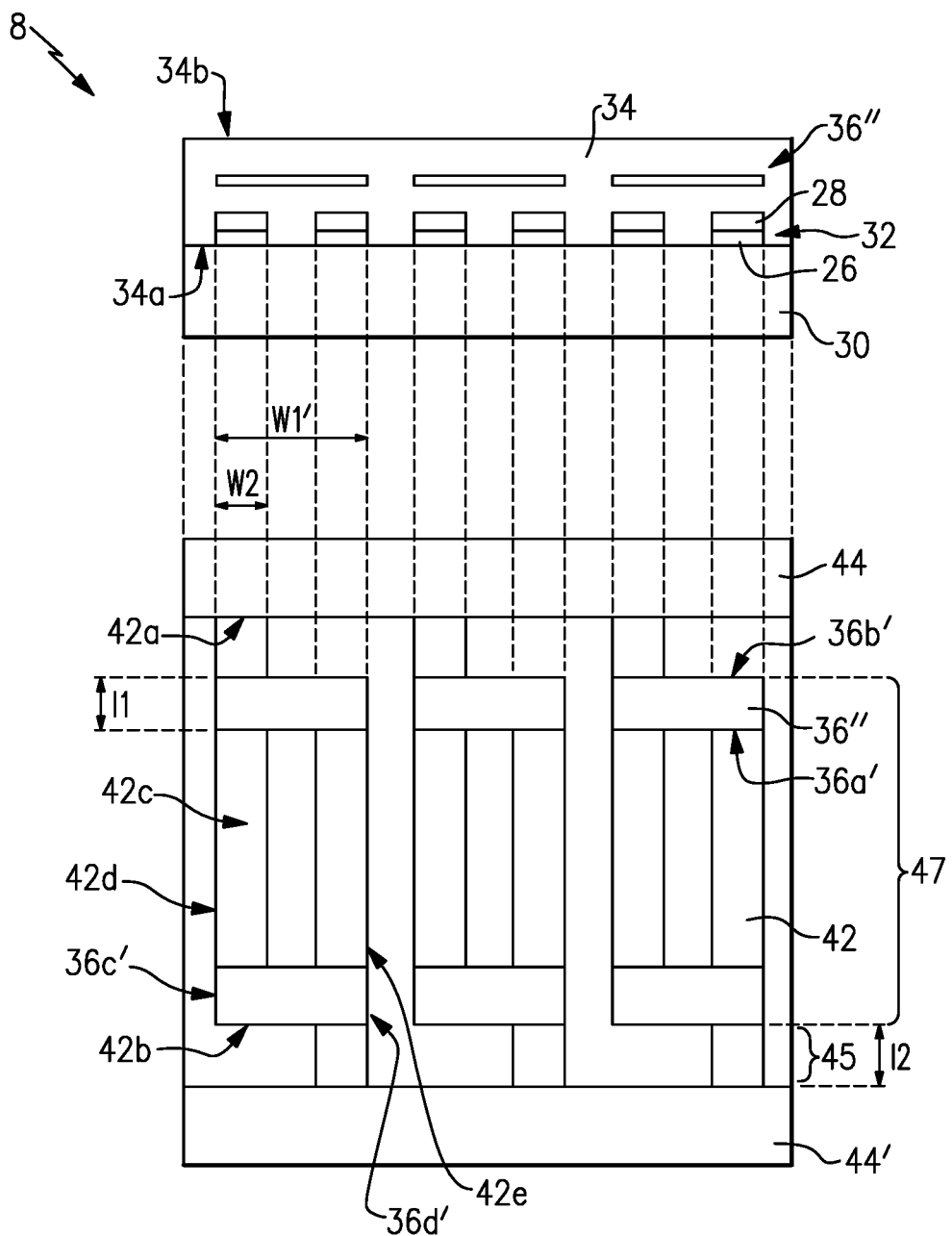
FIG. 9 illustrates a cross section and a top view of a SAW resonator according to another embodiment.

In certain applications, the patterned conductive layer 36 with the separated islands can beneficially mitigate and/or reduce the chance of delamination of the patterned conductive layer 36 as compared to the metal strip 16 of the SAW resonator 1 illustrated in FIGS. 1A and 1B. The separated islands can release the mechanical stress during a fabrication process more effectively than the metal strip 16 of the SAW resonator 1 illustrated in FIGS. 1A and 1B. The similar benefit may be realized even when the islands of the patterned conductive layer 36 are not completely separated apart. For example, the patterned conductive layer 36 can be patterned such that portions that overlaps the fingers 42, 42' can be wider than other portions. In some embodiments, an island can overlap with two or more adjacent IDT electrode fingers, for example, as illustrated in FIG. 9. In some other embodiments, there can be a break between a first island and a second island that overlaps with one or more other IDT electrode fingers.

In some embodiments, the SAW resonator 2 with the separated islands of the patterned conductive material 36 can provide less capacitance than the metal strip 16 of the SAW resonator 1. A parasitic capacitive coupling between IDT electrode ports can be reduced by disconnecting an electrical path in the patterned conductive material 36. Such reduction in parasitic capacitance can improve the electromechanical coupling coefficient ($k^2$) of the SAW resonator 2. Also, the SAW resonator 2 with the separated islands of the patterned conductive material 36 can provide a larger contact surface area between the patterned conductive material 36 and the temperature compensation layer 34 as compared to having a continuous conductive material (such as the metal strip 16 illustrated in FIG. 1A), for the same amount of conductive material. This can increase adhesion strength between the patterned conductive material 36 and the surrounding temperature compensation layer 34.

FIG. 3A illustrates a cross section of a surface acoustic wave (SAW) resonator 3. The SAW resonator 3 includes a piezoelectric layer 30, an IDT electrode 32 over the piezoelectric layer 30, a temperature compensation layer 34 over the IDT electrode 32, and a patterned conductive layer 36' buried in the temperature compensation layer 34. Unlike the SAW resonator 2 illustrated in FIGS. 2A and 2B, the patterned conductive layer 36' of the SAW resonator 3 does not overlap fingers of the IDS electrode 32. Rather, the patterned conductive layer 36' is patterned such that the patterned conductive layer 36' is positioned laterally between the fingers of the IDT electrode 32.

FIG. 3B illustrates a top view of the SAW resonator 3 of FIG. 3A. For the showing the underlying layers more clearly, the temperature compensation layer 34 is not illustrated in FIG. 3B. The dashed lines between FIGS. 3A and 3B show relative positions of the illustrated components. The cross section of FIG. 3A corresponds to the top view of the SAW resonator 3 in view 3B along a line extending through the conductive layer 36'. As with the SAW resonator 2 illustrated in FIGS. 2A and 2B, the IDT electrode 32 of the illustrated SAW resonator 3 of FIGS. 3A and 3B includes two bus bars 44, 44' and two fingers 42 extending from one of the bus bars 44 and a finger 42' extending from the other bus bar 44'. As illustrated, no portion of the patterned conductive layer 36' overlaps with the IDT electrode 32.

FIG. 4 is graph showing simulated velocities of a surface acoustic wave in three similar surface acoustic wave (SAW) resonators. The x-axis shows the velocity of a surface acoustic wave and the y-axis shows thickness of the metal strip 16 or the patterned conductive layer 36 or 36'. First simulation results 50 are for the SAW resonator 1 illustrated in FIGS. 1A and 1B. Second simulation results 52 are for the SAW resonator 2 illustrated in FIGS. 2A and 2B. Third simulation results 54 are for the SAW resonator 3 illustrated in FIGS. 3A and 3B. In the simulation, a lithium niobate (LN) piezoelectric layer was used as the piezoelectric layer 30 and a silicon dioxide layer was used as the temperature compensation layer 34 for the SAW resonators 1, 2, 3. FIG. 4 indicates that the SAW resonator 1 and the SAW resonator 2 can provide generally the similar velocity differences, while the SAW resonator 3 does not affect the velocity significantly, as compared to the SAW resonators 1 and the SAW resonator 2.

For example, a target velocity difference $\Delta V_T$ for a piston mode operation may be about 80 m/s. For the SAW resonator 1 and the SAW resonator 2, the target velocity difference $\Delta V_T$ can be obtained with thicknesses of the metal strip 16 and the patterned conductive layer 36, respectively, of about 0.005 L to 0.02 L. Therefore, the patterned conductive layer 36 can provide a generally similar velocity difference as the conductive strip 16, while reducing the chance of delamination of the patterned conductive layer 36 as compared to the metal strip 16.

FIG. 5 illustrates a SAW resonator 2' according to an embodiment. The SAW resonator 2' is similar to the SAW resonator 2 of FIG. 2A except that the islands of the patterned conductive layer 36 extend beyond fingers of the IDT electrode 32 in the lateral direction of the cross sectional illustration of FIG. 5. The patterned conductive layer 36 of SAW resonator 2' includes islands that are separated from one another. An island of the patterned conducive layer 36 has side edges 36c, 36d. The island of the patterned conductive layer 36 has an island width w1 from the side edge 36c to the other side edge 36d. A finger 42, 42' has side edges 42d, 42e. The finger has a finger width w2 from the side edge 42d to the other side edge 42e.

In certain embodiments, the SAW resonator 2' can have the island width w1 that is wider than the finger width w2. For example, the island width w1 can be wide enough that even with a 5% variation Δw along the width, the island width w1 is still as wide as or wider than the finger width. For example, the island width w1 can be 1% to 11% wider than the finger width w2.

In some embodiments, the width w1 of the patterned conductive layer 36 can be within 5% (e.g., ±5%) of the width w2 of the finger 42 of the IDT electrode 32. In some embodiments, a sum of the variations Δw at both side edges 36c, 36d can be less than 5%. Likewise, width w1 of the patterned conductive layer 36 can be within −5% of the width w2 of the finger 42.

In some instances, having the width w1 of the patterned conductive layer 36 wider than the width w2 of the finger 42 can provide a more robust performance than the width w1 that is narrower than the width w2. Beneficially, by changing the width w1 of the patterned conductive layer 36, the sensitivity of the patterned conductive layer 36 may be controlled.

Figure 6A:
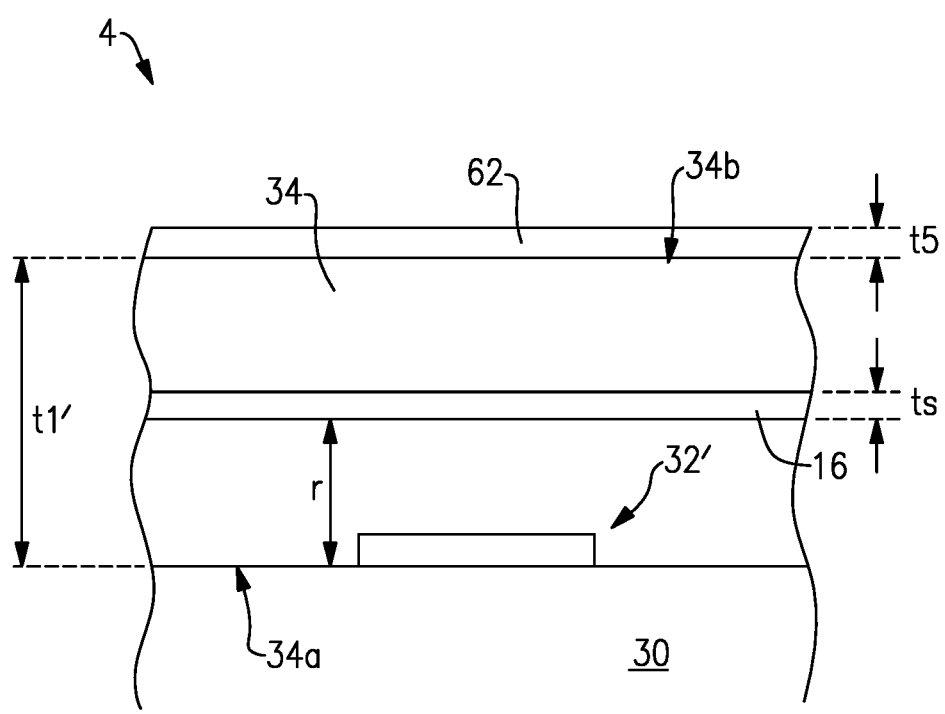
FIG. 6A illustrates a cross section of a SAW resonator according to another embodiment.

FIG. 6A illustrates a cross section of a portion of a surface acoustic wave (SAW) resonator 4. The resonator 4 illustrated in FIG. 6A is generally similar to the resonator 1 illustrated in FIGS. 1A and 1B. However, unlike the resonator 1, the resonator 4 includes a silicon nitride (SiN) layer 62 over the temperature compensation layer 34. The SiN layer 62 can be disposed entirely or partially over an upper surface 34b opposite a lower surface 34a of the temperature compensation layer 34. The SiN layer 62 can cause a magnitude of the velocity in the underlying region of the SAW resonator 4 to be increased.

The metal strip 16 can be disposed at any suitable position that is a distance r from the piezoelectric layer 30 (or from the lower surface 34a of the temperature compensation layer 34). The distance r may be selected relative to a thickness t1' of the temperature compensation layer 34. For example, the distance r can be in a range from 0.2×t1' to 0.8×t1' (e.g., 20% to 80% of the thickness t1') in some embodiments, in which t1' is the thickness of the temperature compensation layer 34. When the SiN layer 62 is disposed over the temperature compensation layer 34, it may be preferable for the distance r to be in a range from 0.4×t1 to 0.6×t1' (e.g., 40% to 60% of the thickness t1').

Figure 6C:
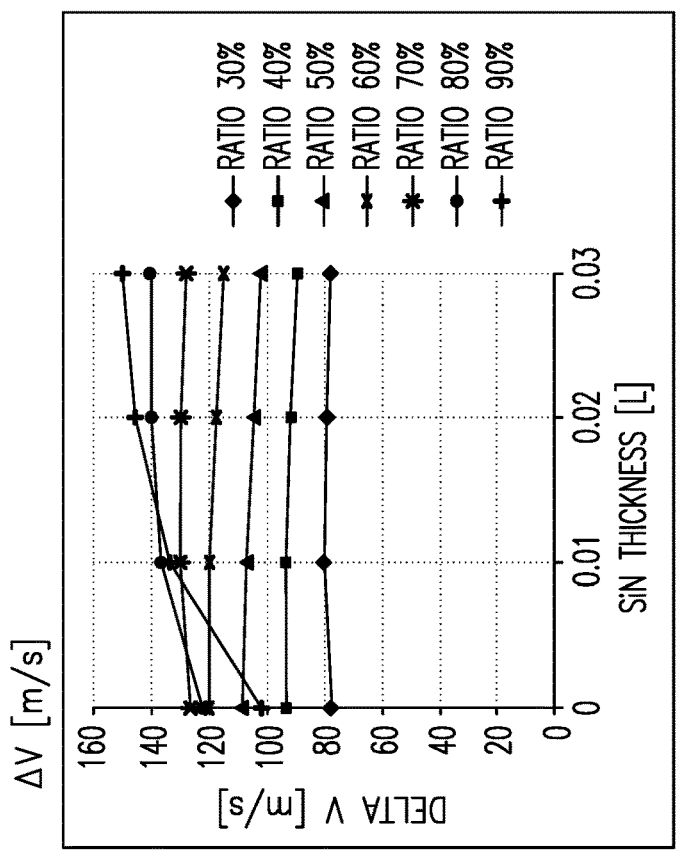
FIG. 6C is a graph showing simulated velocity differences of variations of the SAW resonator of FIG. 6A.
Figure 6B:
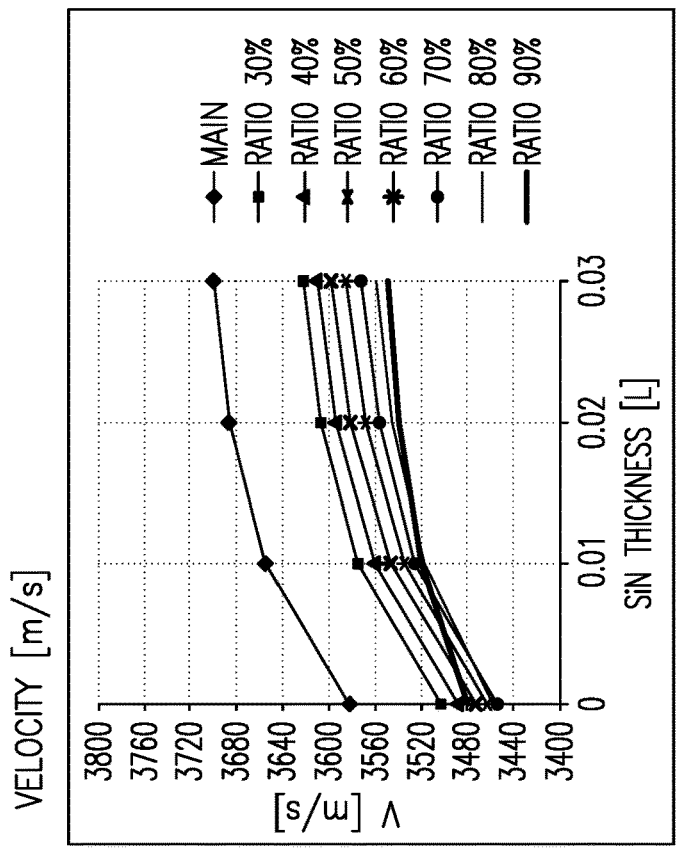
FIG. 6B is a graph showing simulated velocities of variations of the SAW resonator of FIG. 6A.

FIG. 6B is a graph showing simulated velocities of a surface acoustic wave in the SAW resonator 4 illustrated in FIG. 6A. The x-axis shows the velocity of the surface acoustic wave and the y-axis shows a thickness t5 of the SiN layer 62. FIG. 6C is graph showing simulated velocity differences of a surface acoustic wave in the SAW resonator 4 illustrated in FIG. 6A. The x-axis shows the velocity difference of the surface acoustic wave and the y-axis shows the thickness t5 of the SiN layer 62. The simulations were performed for various distances r (e.g., r=30%, 40%, 50%, 60%, 70%, 80%, and 90%) relative to the thickness t1' of the temperature compensation layer 34. In the simulation: a 128-lithium niobate (128 LN) layer was used as the piezoelectric layer 30; a molybdenum IDT electrode was used as the IDT electrode 32 a silicon dioxide ($SiO_2$) was used as the temperature compensation layer 34; and a molybdenum strip with a thickness is of 0.015 L was used as the metal strip 16.

In some applications, it can be preferable to maintain the velocity differences as the thickness t5 of the SiN layer 62 increases. It can be observed from the graphs of FIGS. 6B and 6C that the SAW resonator 4 with the metal strip 16 positioned at a distance r that is 0.5×t1' (e.g., 50% of the thickness t1') provides a relatively high velocity differences throughout different thicknesses t5 of the SiN layer 62 without much variation. The SAW resonator 4 with the metal strip 16 positioned at distance r in a range from 0.4×t1' to 0.6×t1' (e.g., 40% to 60% of the thickness t1') can also provide a relatively high velocity difference throughout different thicknesses t5 of the SiN layer 62 without much variation. Such embodiments can maintain suppressed transverse mode when performing a frequency trimming. Similar results can be expected for a similar SAW resonator with a patterned conductive layer 36 disclosed herein in place of the metal strip 16.

Although the patterned conductive layer 36 is buried in the temperature compensation layer 34 in certain embodiments disclosed herein, the patterned conductive layer 36 can be positioned over a surface of the temperature compensation layer 34 that is opposite to the piezoelectric layer 30 in some other embodiments. Example embodiments with a patterned conductive layer 36 that is positioned over a surface of the temperature compensation layer 34 that is opposite to the piezoelectric layer 30 will be discussed with reference to FIGS. 7A, 7B, 7C, 8C, and 8D.

Figure 7C:
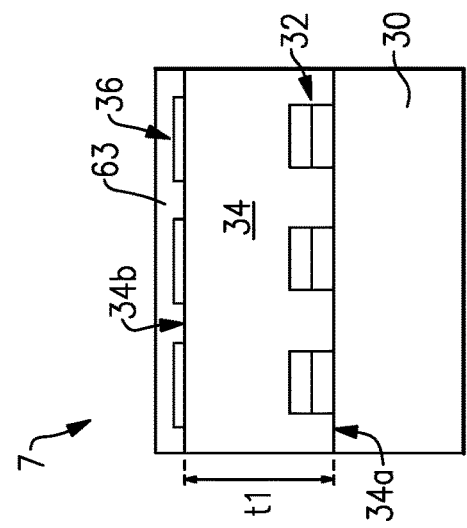
FIG. 7C illustrates a cross section of a SAW resonator according to another embodiment.
Figure 7B:
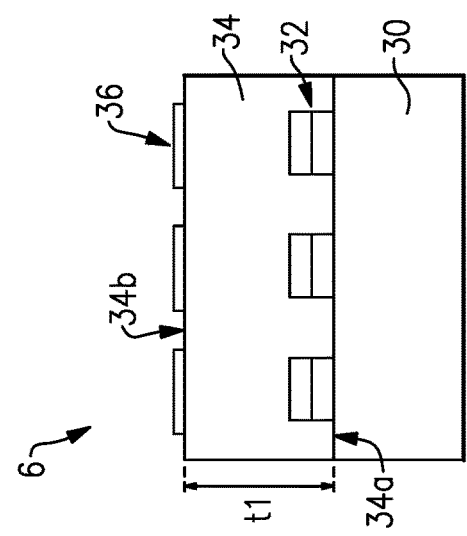
FIG. 7B illustrates a cross section of a SAW resonator according to another embodiment.
Figure 7A:
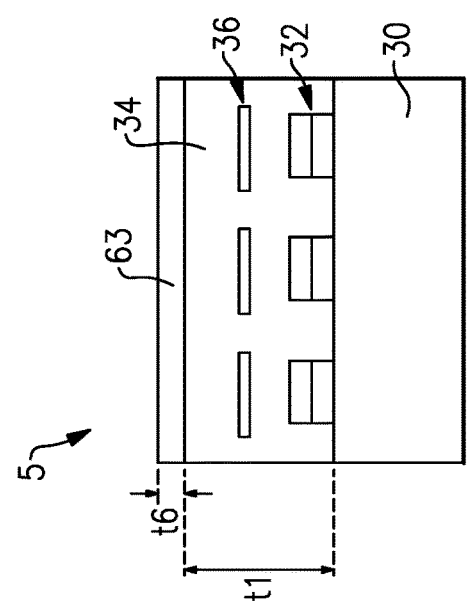
FIG. 7A illustrates a cross section of a SAW resonator according to another embodiment.

FIG. 7A illustrates a cross section of a SAW resonator 5 according to an embodiment. The resonator 5 illustrated in FIG. 7A is generally similar to the resonator 2 illustrated in FIGS. 2A and 2B except that the SAW resonator 5 includes a cover layer 63.

The illustrated cover layer 63 is disposed entirely over an upper surface 34b of the temperature compensation layer 34 in the illustrated cross section. However, the cover layer 63 can be disposed partially over the upper surface 34b of the temperature compensation layer 34 with one or more trenches, in some other instances. In some embodiments, the cover layer 63 can be a dispersion adjustment layer. The dispersion adjustment layer can cause a magnitude of the velocity in the underlying region of the SAW resonator 5 to be increased. In certain applications, the cover layer 63 can include any suitable material to increase the magnitude of the velocity of the underlying region of the SAW resonator 5. According to some applications, the cover layer 63 can include SiN and another material. In some instances, the cover layer 63 can physically protect the SAW resonator 5. Accordingly, the cover layer 63 can be a passivation layer. In some instances, the cover layer 63 can be used for frequency trimming and/or frequency tuning. The cover layer 63 can include a silicon nitride (SiN) layer and/or an aluminum oxide ($Al_2O_3$) layer. The cover layer 63 has a thickness t6. In some embodiments, the thickness t6 of the cover layer 63 can be in a range from 0.001 L to 0.05 L.

FIG. 7B illustrates a cross section of a SAW resonator 6 according to an embodiment. The SAW resonator 6 illustrated in FIG. 7B is generally similar to the resonator 2 illustrated in FIGS. 2A and 2B except that the patterned conductive layer 36 of the SAW resonator 6 is formed on the upper surface 34b of the temperature compensation layer 34.

FIG. 7C illustrates a cross section of a surface acoustic wave SAW resonator 7 according to an embodiment. The resonator 7 illustrated in FIG. 7C is generally similar to the resonator 6 illustrated in FIG. 7B except that the SAW resonator 7 of FIG. 7C includes a cover layer 63 over the patterned conductive layer 36 and the temperature compensation layer 34. The cover layer 63 can be, for example, a SiN layer.

Although a patterned conductive structure includes a single patterned conductive layer in certain embodiments disclosed herein, a patterned conductive structure can include two or more patterned conductive layers in some other embodiments. In such embodiments, the two or more patterned conductive layers can have the same or substantially the same shape in plan view. Example embodiments with a patterned conductive structure with a plurality of patterned conductive layers will be discussed with reference to FIGS. 8A, 8B, 8C, and 8D.

Figure 8A:
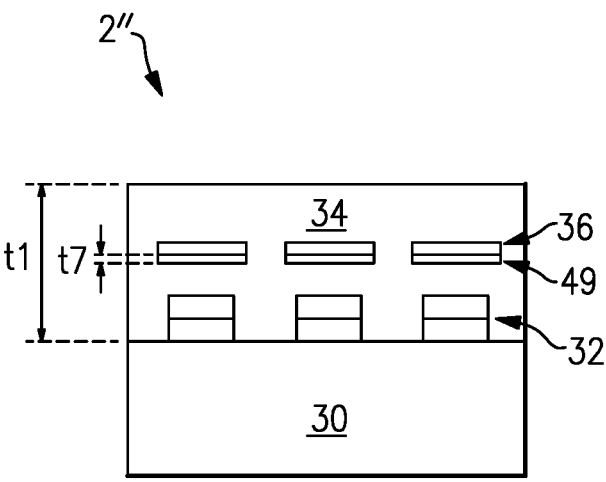
FIG. 8A illustrates a cross section of a SAW resonator according to another embodiment.

FIG. 8A illustrates a cross section of a surface acoustic wave (SAW) resonator 2" according to an embodiment. The resonator 2" illustrated in FIG. 8A is generally similar to the resonator 2' illustrated in FIG. 5 except that a second patterned conductive layer 49 is also included. Together, the patterned conductive layer 36 and the second patterned conductive layer 49 form a patterned conductive structure of the resonator 2". The second patterned conductive layer 49 is positioned between the patterned conductive layer 36 and the piezoelectric layer 30. The second patterned conductive layer 49 can be an adhesion layer. The second patterned conductive layer 49 can provide a better adhesion with the temperature compensation layer 34 than the adhesion between the patterned conductive layer 36 with the temperature compensation layer 34. For example, the second patterned conductive layer 49 can include titanium (Ti), titanium nitride (TiN), aluminum nitride (AlN), tantalum pentoxide ($Ta_2O_5$), or the like. Some materials, such as Ti, can provide a better polarization than a patterned conductive structure with different material for the second patterned conductive layer 49 or without the second patterned conductive layer 49. Accordingly, in certain applications, the second patterned conductive layer 49 can be a titanium (Ti) layer that provides desirable adhesion and desirable polarization. The patterned conductive structure may be formed in any suitable manner. For example, the second patterned conductive layer 49 may be provided over the temperature compensation layer 34 by way of deposition and the high patterned conductive layer 36 may be provided over the adhesion layer 49 by way of deposition.

The second patterned conductive layer 49 can have any suitable thickness t7 that can provide an improved adhesion as compared to the patterned conductive layer 36 without the second patterned conductive layer 49. For example, the thickness t7 of the second patterned conductive layer 49 can be less than 50 nm. In certain embodiments, the thickness t7 of the second patterned conductive layer 49 can be in a range from 10 nm to 50 nm to provide an improved polarization.

Figure 8B:
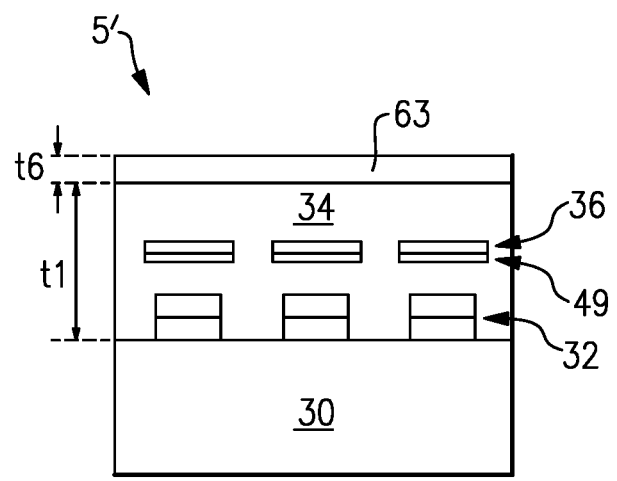
FIG. 8B illustrates a cross section of a SAW resonator according to another embodiment.

FIG. 8B illustrates a cross section of a SAW resonator 5' according to an embodiment. The resonator 5' illustrated in FIG. 8B is generally similar to the resonator 5 illustrated in FIG. 7A expect that the SAW resonator 5' illustrated in FIG. 8B includes a second patterned conductive layer 49.

Figure 8C:
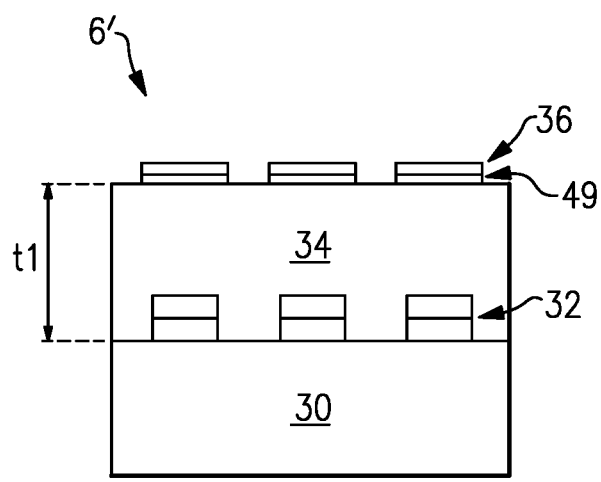
FIG. 8C illustrates a cross section of a SAW resonator according to another embodiment.

FIG. 8C illustrates a cross section of a SAW resonator 6' according to an embodiment. The resonator 6' illustrated in FIG. 8C is generally similar to the resonator 6 illustrated in FIG. 7B except that the SAW resonator 6' illustrated in FIG. 8C includes a second patterned conductive layer 49.

Figure 8D:
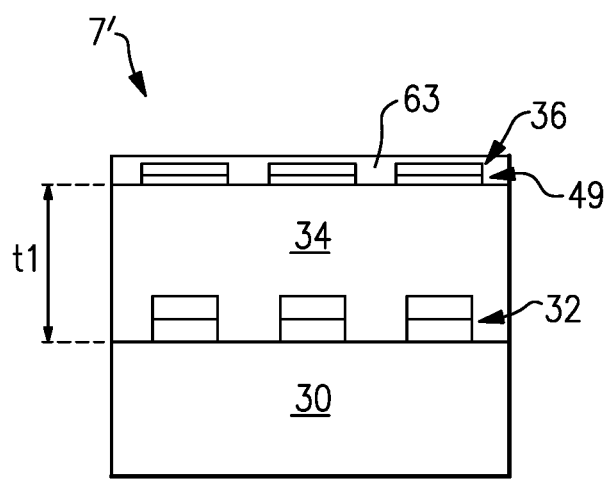
FIG. 8D illustrates a cross section of a SAW resonator according to another embodiment.

FIG. 8D illustrates a cross section of a SAW resonator 7' according to an embodiment. The resonator 7' illustrated in FIG. 8D is generally similar to the resonator 7 illustrated in FIG. 7C except that the SAW resonator 7' illustrated in FIG. 8D includes a second patterned conductive layer 49.

FIG. 9 illustrates a cross section and a top view of a SAW resonator 8 according to an embodiment. The resonator 8 includes a piezoelectric layer 30, an IDT electrode 32 over the piezoelectric layer 30, and a temperature compensation layer 34 over the IDT electrode 32. The SAW resonator 8 also includes a patterned conductive structure (e.g., a patterned conductive layer 36") buried in the temperature compensation layer 34. The patterned conductive layer 36" can include conductive portions. Each of the conductive portions can be an island that overlap with two or more adjacent IDT electrode fingers. The island illustrated in FIG. 9 overlaps with two adjacent IDT electrode fingers 42, 42' that respectively extends from bus bars 44, 44'. In some other embodiments, the patterned conductive layer 36" can be included in a multilayer patterned conductive structure.

Embodiments with a patterned conductive structure that includes conductive portions overlapping two or more adjacent IDT electrode fingers can ease manufacturing parameters in certain applications.

A method of manufacturing an acoustic wave resonator according to an embodiment will now be described. The method can include providing an acoustic wave resonator structure with a temperature compensation layer over an interdigital transducer electrode. The interdigital transducer electrode is positioned on a piezoelectric layer. The interdigital transducer electrode includes fingers extending from a bus bar. The fingers each include an edge portion and a body portion. The method includes forming a patterned conductive layer that at least overlaps with the edge portions of the fingers of the interdigital transducer electrode. The patterned conductive layer can include a layer having a density at least as high as a density of a material of the interdigital transducer electrode that is in contact with the piezoelectric layer. A portion of the temperature compensation layer is positioned between the patterned conductive layer and the interdigital transducer electrode. A second patterned conductive layer can also be formed over the piezoelectric layer such that the second patterned conductive layer is positioned between the piezoelectric layer and the patterned conductive layer. The patterned conductive layer can include conductive portions (e.g., island portions) that are separated from one another. The island portions of the patterned conductive layer can be spaced a part by another portion of the temperature compensation layer.

A method of filtering a radio frequency signal according to an embodiment will now be described. The method includes receiving a radio frequency signal at an input port of an acoustic wave filter that includes an acoustic wave resonator. The acoustic wave resonator includes a piezoelectric layer, an interdigital transducer electrode on the piezoelectric layer, and a patterned conductive layer that overlaps edge portions of fingers of the interdigital transducer electrode. The patterned conductive layer can include a layer having a density that is at least as high as a density of a material of the interdigital transducer electrode that is in contact with the piezoelectric layer. The method also includes filtering the radio frequency signal with the acoustic wave filter. The filtering includes suppressing a transverse mode using the patterned conductive layer of the acoustic wave resonator. The filtering can be performed, for example, with a transmit filter 85 of FIG. 10 or a receive filter 90 of FIG. 11 discussed below.

Figure 10:
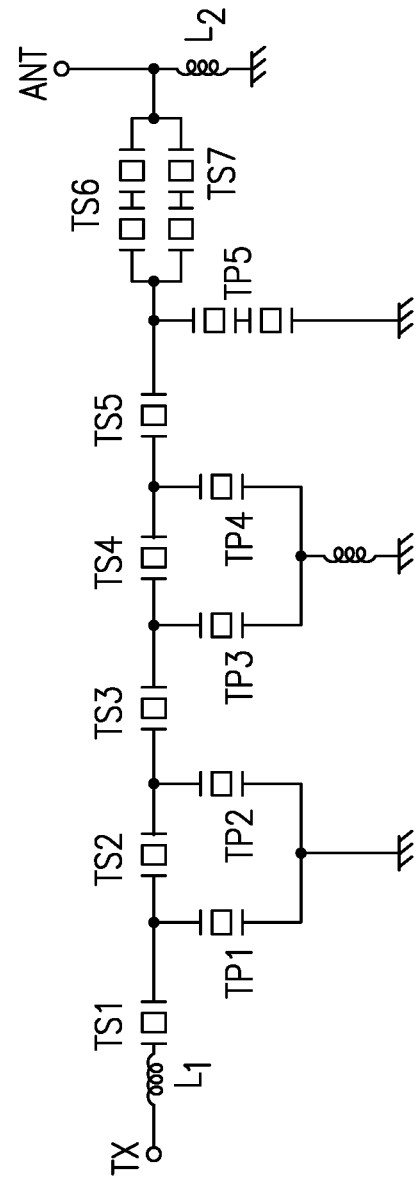
FIG. 10 is a schematic diagram of a transmit filter that includes a surface acoustic wave resonator according to an embodiment.

FIG. 10 is a schematic diagram of an example transmit filter 85 that includes surface acoustic wave resonators according to an embodiment. The transmit filter 85 can be a band pass filter. The illustrated transmit filter 85 is arranged to filter a radio frequency signal received at a transmit port TX and provide a filtered output signal to an antenna port ANT. Some or all of the SAW resonators TS1 to TS7 and/or TP1 to TP5 can be a SAW resonators in accordance with any suitable principles and advantages disclosed herein. For instance, one or more of the SAW resonators of the transmit filter 85 can be a surface acoustic wave resonator 2 of FIGS. 2A and 2B. Alternatively or additionally, one or more of the SAW resonators of the transmit filter 85 can be any surface acoustic wave resonator disclosed herein. Any suitable number of series SAW resonators and shunt SAW resonators can be included in a transmit filter 85.

Figure 11:
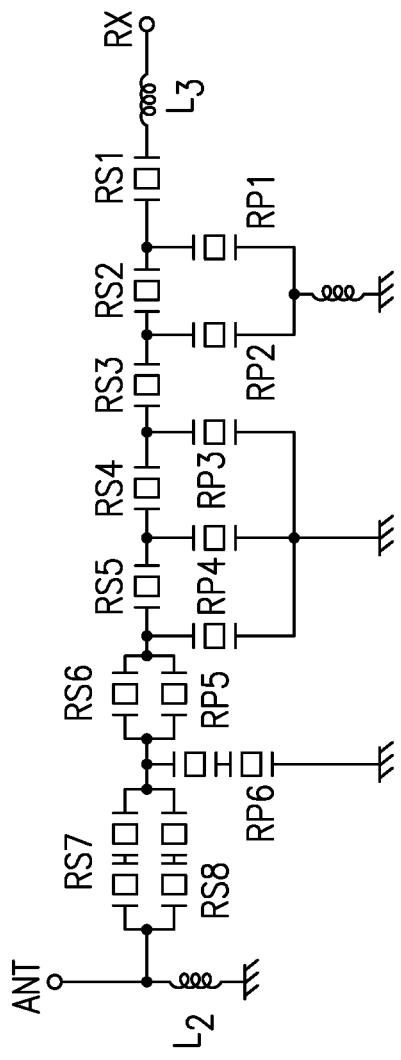
FIG. 11 is a schematic diagram of a receive filter that includes a surface acoustic wave resonator according to an embodiment.

FIG. 11 is a schematic diagram of a receive filter 90 that includes surface acoustic wave resonators according to an embodiment. The receive filter 90 can be a band pass filter. The illustrated receive filter 90 is arranged to filter a radio frequency signal received at an antenna port ANT and provide a filtered output signal to a receive port RX. Some or all of the SAW resonators RS1 to RS8 and/or RP1 to RP6 can be SAW resonators in accordance with any suitable principles and advantages disclosed herein. For instance, one or more of the SAW resonators of the receive filter 90 can be a surface acoustic wave resonator 2 of FIGS. 2A and 2B. Alternatively or additionally, one or more of the SAW resonators of the receive filter 90 can be any surface acoustic wave resonator disclosed herein. Any suitable number of series SAW resonators and shunt SAW resonators can be included in a receive filter 90.

Figure 12:
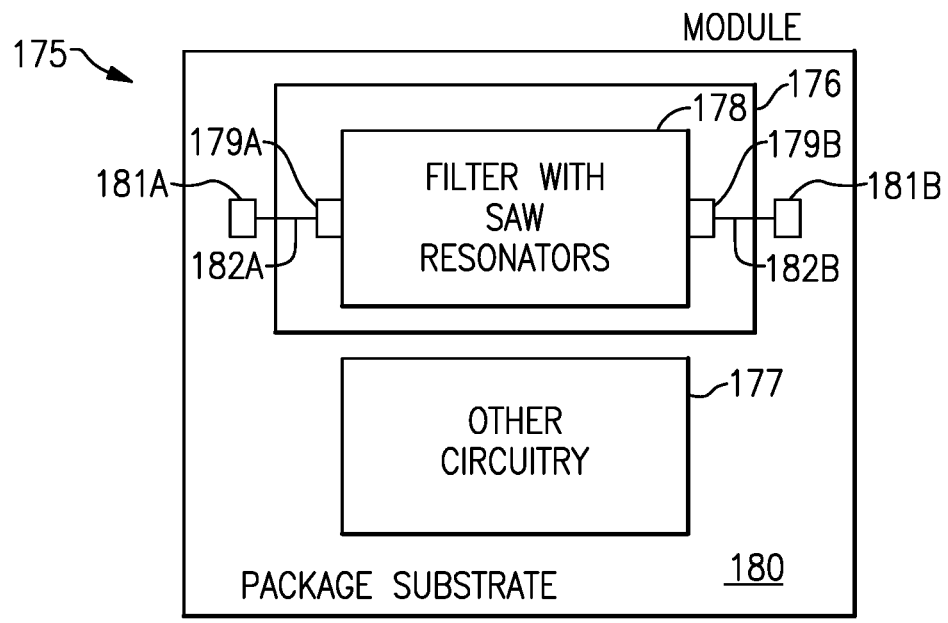
FIG. 12 is a schematic diagram of a radio frequency module that includes a surface acoustic wave resonator according to an embodiment.

FIG. 12 is a schematic diagram of a radio frequency module 175 that includes a surface acoustic wave component 176 according to an embodiment. The illustrated radio frequency module 175 includes the SAW component 176 and other circuitry 177. The SAW component 176 can include one or more SAW resonators with any suitable combination of features of the SAW resonators disclosed herein. The SAW component 176 can include a SAW die that includes SAW resonators.

The SAW component 176 shown in FIG. 12 includes a filter 178 and terminals 179A and 179B. The filter 178 includes SAW resonators. One or more of the SAW resonators can be implemented in accordance with any suitable principles and advantages of the surface acoustic wave resonator 2 of FIG. 2, and/or any surface acoustic wave resonator disclosed herein. The filter 178 can be a TCSAW filter arranged as a band pass filter to filter radio frequency signals with frequencies below about 3.5 GHz in certain applications. The terminals 179A and 178B can serve, for example, as an input contact and an output contact. The SAW component 176 and the other circuitry 177 are on a common packaging substrate 180 in FIG. 12. The package substrate 180 can be a laminate substrate. The terminals 179A and 179B can be electrically connected to contacts 181A and 181B, respectively, on the packaging substrate 180 by way of electrical connectors 182A and 182B, respectively. The electrical connectors 182A and 182B can be bumps or wire bonds, for example. The other circuitry 177 can include any suitable additional circuitry. For example, the other circuitry can include one or more one or more power amplifiers, one or more radio frequency switches, one or more additional filters, one or more low noise amplifiers, the like, or any suitable combination thereof. The radio frequency module 175 can include one or more packaging structures to, for example, provide protection and/or facilitate easier handling of the radio frequency module 175. Such a packaging structure can include an overmold structure formed over the packaging substrate 180. The overmold structure can encapsulate some or all of the components of the radio frequency module 175.

Figure 13:
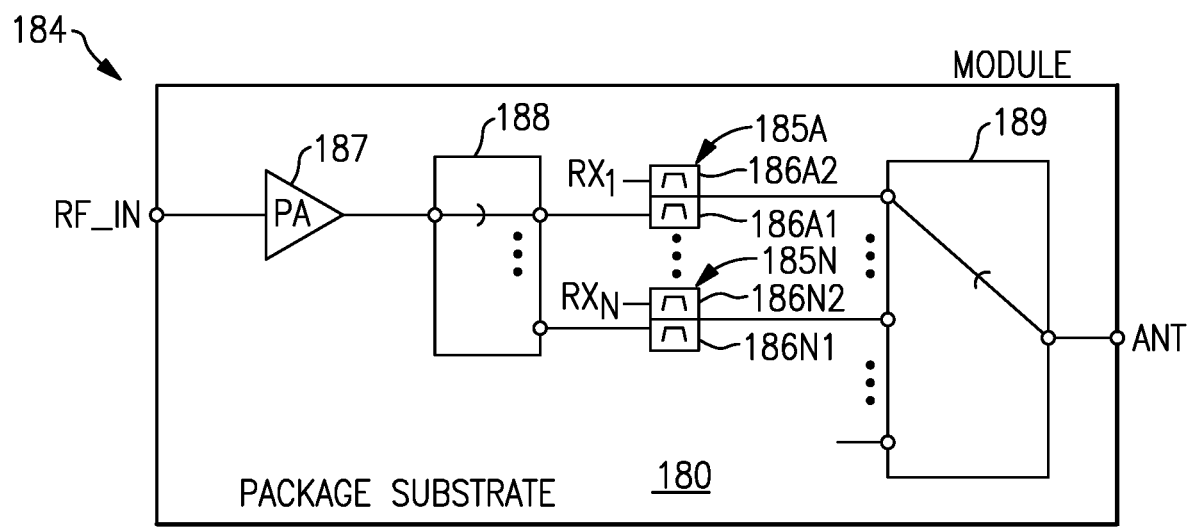
FIG. 13 is a schematic diagram of a radio frequency module that includes filters with surface acoustic wave resonators according to an embodiment.

FIG. 13 is a schematic diagram of a radio frequency module 184 that includes a surface acoustic wave component according to an embodiment. As illustrated, the radio frequency module 184 includes duplexers 185A to 185N that include respective transmit filters 186A1 to 186N1 and respective receive filters 186A2 to 186N2, a power amplifier 187, a select switch 188, and an antenna switch 189. In some instances, the module 184 can include one or more low noise amplifiers configured to receive a signal from one or more receive filters of the receive filters 186A2 to 186N2. The radio frequency module 184 can include a package that encloses the illustrated elements. The illustrated elements can be disposed on a common packaging substrate 180. The packaging substrate can be a laminate substrate, for example.

The duplexers 185A to 185N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 186A1 to 186N1 can include one or more SAW resonators in accordance with any suitable principles and advantages disclosed herein. Similarly, one or more of the receive filters 186A2 to 186N2 can include one or more SAW resonators in accordance with any suitable principles and advantages disclosed herein. Although FIG. 13 illustrates duplexers, any suitable principles and advantages disclosed herein can be implemented in other multiplexers (e.g., quadplexers, hexaplexers, octoplexers, etc.) and/or in switch-plexers.

The power amplifier 187 can amplify a radio frequency signal. The illustrated switch 188 is a multi-throw radio frequency switch. The switch 188 can electrically couple an output of the power amplifier 187 to a selected transmit filter of the transmit filters 186A1 to 186N1. In some instances, the switch 188 can electrically connect the output of the power amplifier 187 to more than one of the transmit filters 186A1 to 186N1. The antenna switch 189 can selectively couple a signal from one or more of the duplexers 185A to 185N to an antenna port ANT. The duplexers 185A to 185N can be associated with different frequency bands and/or different modes of operation (e.g., different power modes, different signaling modes, etc.).

Figure 14:
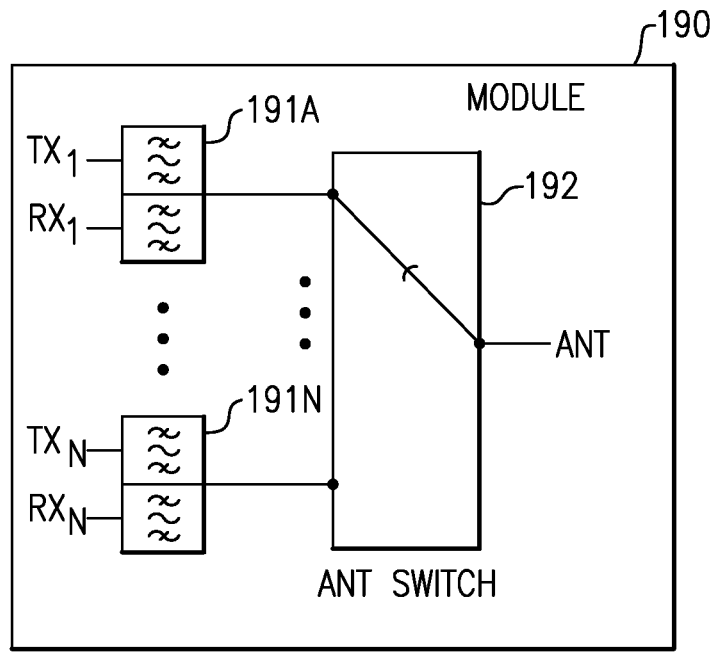
FIG. 14 is a schematic block diagram of a module that includes an antenna switch and duplexers that include a surface acoustic wave resonator according to an embodiment.

FIG. 14 is a schematic block diagram of a module 190 that includes duplexers 191A to 191N and an antenna switch 192. One or more filters of the duplexers 191A to 191N can include any suitable number of surface acoustic wave resonators in accordance with any suitable principles and advantages discussed herein. Any suitable number of duplexers 191A to 191N can be implemented. The antenna switch 192 can have a number of throws corresponding to the number of duplexers 191A to 191N. The antenna switch 192 can electrically couple a selected duplexer to an antenna port of the module 190.

Figure 15:
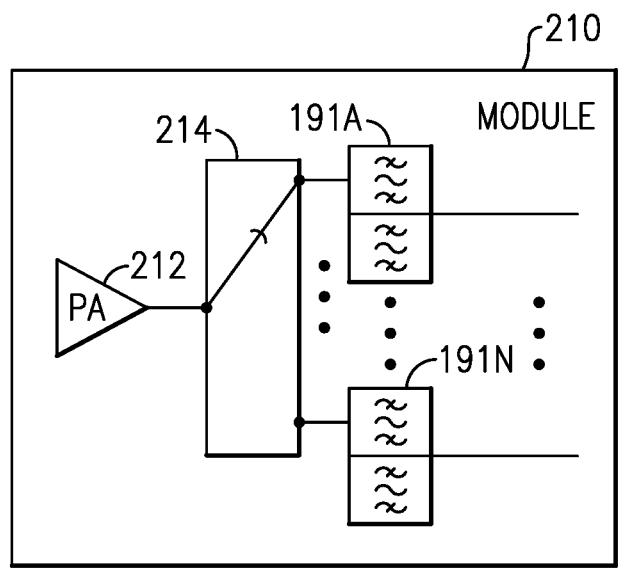
FIG. 15 is a schematic block diagram of a module that includes a power amplifier, a radio frequency switch, and duplexers that include a surface acoustic wave resonator according to an embodiment.

FIG. 15 is a schematic block diagram of a module 210 that includes a power amplifier 212, a radio frequency switch 214, and duplexers 191A to 191N in accordance with one or more embodiments. The power amplifier 212 can amplify a radio frequency signal. The radio frequency switch 214 can be a multi-throw radio frequency switch. The radio frequency switch 214 can electrically couple an output of the power amplifier 212 to a selected transmit filter of the duplexers 191A to 191N. One or more filters of the duplexers 191A to 191N can include any suitable number of surface acoustic wave resonators in accordance with any suitable principles and advantages discussed herein. Any suitable number of duplexers 191A to 191N can be implemented.

Figure 16A:
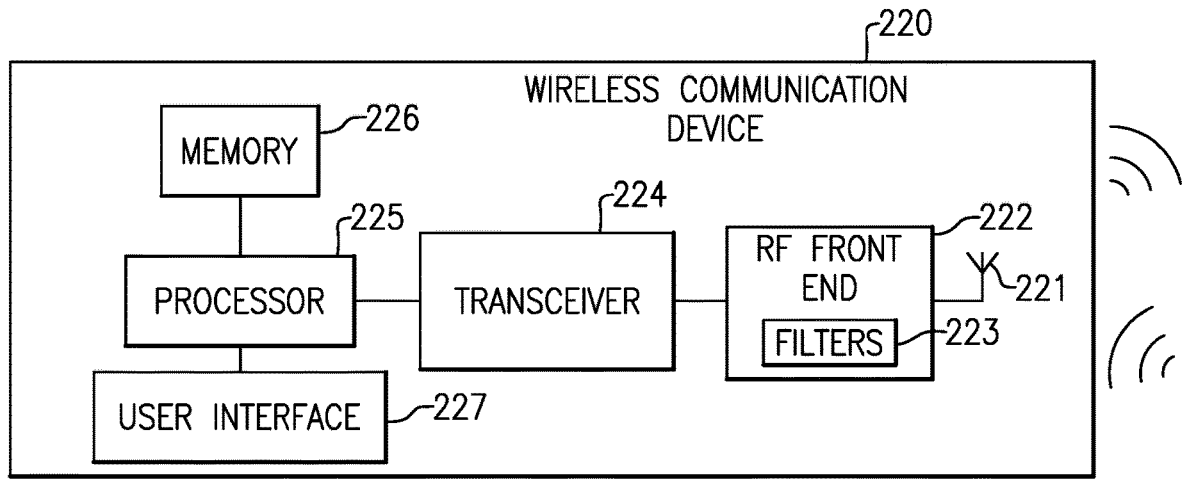
FIG. 16A is a schematic block diagram of a wireless communication device that includes a filter with a surface acoustic wave resonator in accordance with one or more embodiments.

FIG. 16A is a schematic diagram of a wireless communication device 220 that includes filters 223 in a radio frequency front end 222 according to an embodiment. The filters 223 can include one or more SAW resonators in accordance with any suitable principles and advantages discussed herein. The wireless communication device 220 can be any suitable wireless communication device. For instance, a wireless communication device 220 can be a mobile phone, such as a smart phone. As illustrated, the wireless communication device 220 includes an antenna 221, an RF front end 222, a transceiver 224, a processor 225, a memory 226, and a user interface 227. The antenna 221 can transmit/receive RF signals provided by the RF front end 222. Such RF signals can include carrier aggregation signals. Although not illustrated, the wireless communication device 220 can include a microphone and a speaker in certain applications.

The RF front end 222 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 222 can transmit and receive RF signals associated with any suitable communication standards. The filters 223 can include SAW resonators of a SAW component that includes any suitable combination of features discussed with reference to any embodiments discussed above.

The transceiver 224 can provide RF signals to the RF front end 222 for amplification and/or other processing. The transceiver 224 can also process an RF signal provided by a low noise amplifier of the RF front end 222. The transceiver 224 is in communication with the processor 225. The processor 225 can be a baseband processor. The processor 225 can provide any suitable base band processing functions for the wireless communication device 220. The memory 226 can be accessed by the processor 225. The memory 226 can store any suitable data for the wireless communication device 220. The user interface 227 can be any suitable user interface, such as a display with touch screen capabilities.

Figure 16B:
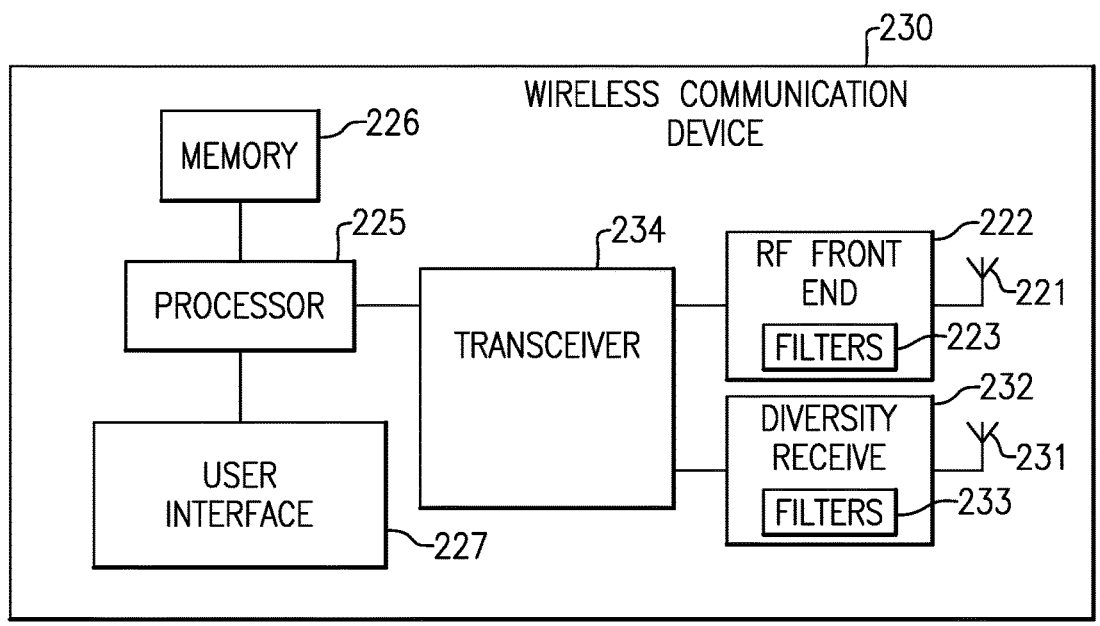
FIG. 16B is a schematic block diagram of another wireless communication device that includes a filter with a surface acoustic wave resonator in accordance with one or more embodiments.

FIG. 16B is a schematic diagram of a wireless communication device 230 that includes filters 223 in a radio frequency front end 222 and a second filter 233 in a diversity receive module 232. The wireless communication device 230 is like the wireless communication device 200 of FIG. 16A, except that the wireless communication device 230 also includes diversity receive features. As illustrated in FIG. 16B, the wireless communication device 230 includes a diversity antenna 231, a diversity module 232 configured to process signals received by the diversity antenna 231 and including filters 233, and a transceiver 234 in communication with both the radio frequency front end 222 and the diversity receive module 232. The filters 233 can include one or more SAW resonators that include any suitable combination of features discussed with reference to any embodiments discussed above.

Although embodiments disclosed herein relate to surface acoustic wave resonators, any suitable principles and advantages disclosed herein can be applied to other types of acoustic wave resonators, such as Lamb wave resonators and/or boundary wave resonators. For example, any suitable combination of features of the patterned conductive structures disclosed herein can be applied to a Lamb wave resonator and/or a boundary wave resonator.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz.

Aspects of this disclosure can be implemented in various electronic devices. Examples of the electronic devices can include, but are not limited to, consumer electronic products, parts of the consumer electronic products such as packaged radio frequency modules and/or packaged filter components, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An acoustic wave resonator configured to generate a wavelength L, the acoustic wave resonator comprising:
    a piezoelectric layer;
    at least first and second interdigital transducer electrodes over the piezoelectric layer, each interdigital transducer electrode including a bus bar and fingers extending from the bus bar, the fingers each including an edge portion and a body portion, the fingers of the first interdigital transducer electrode spaced between with the fingers of the second interdigital transducer electrode;
    a temperature compensation layer over the interdigital transducer electrode, the temperature compensation layer has a thickness from a lower surface to an upper surface opposite the lower surface, the lower surface being closer to the first and second interdigital transducer electrodes than the upper surface; and
    a patterned conductive layer within the temperature compensation layer, the patterned conductive layer that does not overlap the fingers of the first and second interdigital transducer electrodes, the patterned conductive layer having a density that is at least as high as a density of a material of the first and second interdigital transducer electrodes that are in contact with the piezoelectric layer, the patterned conductive layer having an inner most edge and an outer most edge, a length between the inner most edge and the outer most edge being in a range from 0.5 L to 1.5 L, and the patterned conductive layer is spaced apart from the lower surface by a distance that is within 20% to 80% of the thickness of the temperature compensation layer.

2. The acoustic wave resonator of claim 1 further comprising a second bus bar and second fingers extending from the second bus bar, the second fingers each including an edge portion and a body portion.

3. The acoustic wave resonator of claim 2 wherein the patterned conductive layer includes second conductive portions that overlap edge portions of the second fingers.

4. The acoustic wave resonator of claim 3 wherein a portion of the second conductive portions overlaps a portion of a finger of the first fingers that extend from the first bus bar and a portion of a finger of the second fingers that extends from the second bus bar.

5. The acoustic wave resonator of claim 1 wherein the patterned conductive layer includes islands separated from each other, the islands are separated by portions of the temperature compensation layer.

6. The acoustic wave resonator of claim 5 wherein the islands do not overlap the bus bars of the first and second interdigital transducer electrodes.

7. The acoustic wave resonator of claim 1 further comprising a second patterned conductive layer positioned between the patterned conductive layer and the first and second interdigital transducer electrodes, the patterned conductive layer has a higher mass than the second patterned conductive layer.

8. The acoustic wave resonator of claim 7 wherein the second patterned conductive layer is a titanium layer, the patterned conductive layer is a molybdenum layer or a tungsten layer.

9. The acoustic wave resonator of claim 1 wherein the patterned conductive layer includes islands separated from each other, wherein each island has an island width, the island width is at least as wide as a finger width of a respective underlying edge portion of one of the fingers.

10. The acoustic wave resonator of claim 9 wherein the island width has a variation that is ±5% of the finger width of the underlying edge portion.

11. The acoustic wave resonator of claim 1 further comprising a cover layer over the temperature compensation layer, the cover layer is a silicon nitride layer or an aluminum oxide layer.

12. A front end module comprising an acoustic wave filter including acoustic wave resonators arranged to filter a radio frequency signal, the acoustic wave resonators including the acoustic wave resonator of claim 1, other circuitry, and a package enclosing the acoustic wave filter and the other circuitry, the other circuitry includes a multi-throw radio frequency switch or a power amplifier.

13. The acoustic wave resonator of claim 1 wherein the acoustic wave resonator is a surface acoustic wave resonator configured to generate a surface acoustic wave.

14. The acoustic wave resonator of claim 1 wherein a region over the bus bar consists of a portion of the temperature compensation layer.

15. The acoustic wave resonator of claim 1 wherein the patterned conductive layer has a density that is at least as high as a density of a material of the first and second interdigital transducer electrodes that is in contact with the piezoelectric layer.

16. The acoustic wave resonator of claim 1 wherein the patterned conductive layer includes a metal layer.

17. The acoustic wave resonator of claim 1 wherein the fingers of the first interdigital transducer electrode are laterally spaced between with the fingers of the second interdigital transducer electrode and the conductive portions are located in areas between the fingers.

18. The acoustic wave resonator of claim 1 further comprising a second patterned conductive layer positioned between the patterned conductive layer and the first and second interdigital transducer electrodes.

19. The acoustic wave resonator of claim 1 further comprising a cover layer over the temperature compensation layer.

20. The acoustic wave resonator of claim 1 further comprising a second patterned conductive layer positioned between the patterned conductive layer and the first and second interdigital transducer electrodes, the second patterned conductive layer has a higher adhesion than the patterned conductive layer.

* * * * *